(12) United States Patent
Jeong et al.

(10) Patent No.: US 8,049,212 B2
(45) Date of Patent: Nov. 1, 2011

(54) THIN FILM TRANSISTOR, METHOD OF FABRICATING A THIN FILM TRANSISTOR AND FLAT PANEL DISPLAY DEVICE HAVING THE SAME

(75) Inventors: Jae-Kyeong Jeong, Suwon-si (KR); Hyun-Soo Shin, Suwon-si (KR); Yeon-Gon Mo, Suwon-si (KR); Jong-Han Jeong, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 340 days.

(21) Appl. No.: 12/318,212

(22) Filed: Dec. 23, 2008

(65) Prior Publication Data
US 2009/0159879 A1    Jun. 25, 2009

(30) Foreign Application Priority Data
Dec. 24, 2007  (KR) .................. 10-2007-0136751

(51) Int. Cl.
*H01L 33/00* (2010.01)
*H01L 21/336* (2010.01)
(52) U.S. Cl. ........... 257/43; 257/E33.014; 257/E21.411; 438/104
(58) Field of Classification Search ............ 257/43, 257/E33.014, E21.411; 438/104
See application file for complete search history.

(56) References Cited

U.S. PATENT DOCUMENTS

| | | | |
|---|---|---|---|
| 6,355,561 B1 | 3/2002 | Sandhu et al. | |
| 6,727,522 B1 | 4/2004 | Kawasaki et al. | |
| 6,926,572 B2 | 8/2005 | Park et al. | |
| 7,208,768 B2 | 4/2007 | Ono et al. | |
| 7,375,373 B2 * | 5/2008 | Lee et al. | 257/59 |
| 2004/0198029 A1 | 10/2004 | Yasuda et al. | |
| 2006/0110867 A1 * | 5/2006 | Yabuta et al. | 438/151 |
| 2006/0113539 A1 * | 6/2006 | Sano et al. | 257/59 |
| 2006/0165572 A1 * | 7/2006 | McHugh et al. | 423/54 |
| 2010/0267198 A1 * | 10/2010 | Yabuta et al. | 438/104 |

FOREIGN PATENT DOCUMENTS

| | | |
|---|---|---|
| JP | 2000-277742 A | 10/2000 |
| JP | 2003-176109 | 6/2003 |
| JP | 2005-321790 | 11/2005 |
| KR | 10-2001-0089452 A | 10/2001 |
| KR | 10-2003-0064599 A | 8/2003 |

(Continued)

OTHER PUBLICATIONS

Barquinha, P., et al., "Influence of the semiconductor thickness on the electrical properties of transparent TFTs based on indium zinc oxide", Journal of Non-Crystalline Solids, 352:1749-1752 (2006).

Liu, Day-Shan, et al., "Microstructure investigations of indium tin oxide films cosputtered with zinc oxide at room temperature", J. Vac. Sci. Technol. A24(3):694-699 (May/Jun. 2006).

(Continued)

*Primary Examiner* — Victor A Mandala
(74) *Attorney, Agent, or Firm* — Lee & Morse, P.C.

(57) ABSTRACT

A TFT includes a substrate, a transparent semiconductor layer on the substrate, the transparent semiconductor layer including zinc oxide and exhibiting a surface roughness of about 1.3 nm or less, a gate electrode on the transparent semiconductor layer, a gate insulating layer between the gate electrode and the transparent semiconductor layer, the gate insulting layer insulating the gate electrode from the transparent semiconductor layer, and source and drain electrodes on the substrate, the source and drain electrodes being in contact with the transparent semiconductor layer.

15 Claims, 2 Drawing Sheets

| | FOREIGN PATENT DOCUMENTS | |
|---|---|---|
| KR | 10-2004-0014418 A | 2/2004 |
| KR | 10-2005-0092505 A | 9/2005 |
| KR | 10-2006-0024545 A | 3/2006 |
| KR | 10-2007-0035373 A | 3/2007 |
| KR | 10-2007-0085828 A | 8/2007 |
| WO | WO 00/30183 | 5/2000 |
| WO | WO 02/43125 A2 | 5/2002 |

OTHER PUBLICATIONS

Park, Sang-Hee Ko, et al., Characteristics of ZnO Thin Films by Means of Plasma-Enhanced Atomic Layer Deposition:, Electrochemical and Solid-State Letters 9(10):G299-G301 (2006).

* cited by examiner

# THIN FILM TRANSISTOR, METHOD OF FABRICATING A THIN FILM TRANSISTOR AND FLAT PANEL DISPLAY DEVICE HAVING THE SAME

CROSS-REFERENCE TO RELATED APPLICATION

This application is related to co-pending U.S. patent application Ser. No. 12/318,244, entitled "Thin Film Transistor, Method of Fabricating A Thin Film Transistor and Flat Panel Display Device Having the Same," which was filed on Dec. 23, 2008.

BACKGROUND OF THE INVENTION

1. Field of the Invention

Example embodiments relate to a thin film transistor (TFT), to a method of fabricating the same, and to a flat panel display (FPD) device having the same. More particularly, example embodiments relate to a TFT having improved characteristics, to a method of fabricating the same, and to a FPD having the same.

2. Description of the Related Art

With the advent of a highly developed information-oriented society, demands for, e.g., personal computers, car navigation systems, personal digital assistances (PDAs), data communication devices or combination products thereof, are increasing. Such products may require FPD devices with, e.g., good visibility, wide viewing angle characteristics, fast response time, and so forth, for displaying information.

A conventional FPD device, e.g., an organic light emitting diode (OLED) display device, a liquid crystal display (LCD) device, and so forth, may include a TFT as a switching device for driving a pixel in the FPD. A conventional TFT may include a gate electrode on a semiconductor layer, and source/drain electrodes. The semiconductor layer of the conventional TFT, however, may be formed of an opaque material, e.g., amorphous or crystalline silicon. Thus, when a TFT with opaque components is used as a switching device in a FPD device, e.g., an OLED display device, there may be a limit to an increase in width of a channel of the TFT due to the characteristics of the opaque semiconductor layer. A limited channel width of the conventional TFT may limit current flow therethrough and may require high voltage application, thereby increasing power consumption in the FPD, e.g., deteriorating an OLED in an OLED display device and increasing power consumption thereof.

SUMMARY OF THE INVENTION

Embodiments are therefore directed to a TFT, a FPD having the same, and associated methods, which substantially overcome one or more of the disadvantages of the related art.

It is therefore a feature of an embodiment to provide a TFT with a transparent semiconductor layer exhibiting reduced surface roughness.

It is another feature of an embodiment to provide a FPD with a TFT having a transparent semiconductor layer exhibiting reduced surface roughness.

It is yet another feature of an embodiment to provide a method of manufacturing a TFT having a transparent semiconductor layer exhibiting reduced surface roughness.

At least one of the above and other features and advantages may be realized by providing a TFT, including a substrate, a transparent semiconductor layer on the substrate, the transparent semiconductor layer including zinc oxide and exhibiting a surface roughness of about 1.3 nm or less, a gate electrode on the transparent semiconductor layer, a gate insulating layer between the gate electrode and the transparent semiconductor layer, the gate insulting layer insulating the gate electrode from the transparent semiconductor layer, and source and drain electrodes on the substrate, the source and drain electrodes being in contact with the transparent semiconductor layer. The substrate may include one or more of a single crystalline silicon, glass, plastic, sapphire and quartz. The transparent semiconductor layer may have a thickness of about 30 nm to about 150 nm.

At least one of the above and other features and advantages may be realized by providing a method of fabricating TFT, including forming a transparent semiconductor layer on a substrate, the transparent semiconductor layer including zinc oxide and exhibiting a surface roughness of about 1.3 nm or less, forming a gate insulating layer on the transparent semiconductor layer, forming a gate electrode on the gate insulting layer, the gate insulting layer insulating the gate electrode from the transparent semiconductor layer, and source and drain electrodes on the substrate, the source and drain electrodes being in contact with the transparent semiconductor layer.

The method may further include forming a buffer layer between the substrate and the transparent semiconductor layer, and forming an interlayer insulating layer on the gate electrode, the source and drain electrodes being on the interlayer insulating layer. Forming the transparent semiconductor layer may include forming a zinc oxide layer on the substrate by atomic layer deposition, and patterning the zinc oxide layer to form the transparent semiconductor layer. The atomic layer deposition may include using water vapor ($H_2O$) and/or ozone ($O_3$) as oxidizing agents. Forming the transparent semiconductor layer may include forming the transparent semiconductor layer to a thickness of about 30 nm to about 150 nm. The substrate may be formed of one or more of a single crystalline silicon, glass, plastic, sapphire and quartz.

At least one of the above and other features and advantages may be realized by providing a FPD device, including a TFT with a transparent semiconductor layer on a substrate, the transparent semiconductor layer including zinc oxide and exhibiting a surface roughness of about 1.3 nm or less, a gate electrode on the transparent semiconductor layer, a gate insulating layer between the gate electrode and the transparent semiconductor layer, the gate insulting layer insulating the gate electrode from the transparent semiconductor layer, and forming source and drain electrodes on the substrate, the source and drain electrodes being in contact with the transparent semiconductor layer, and a pixel part including at least one pixel and being in electrical communication with the TFT via at least one of the source and drain electrodes of the TFT.

The substrate of the TFT may include one or more of a single crystalline silicon, glass, plastic, sapphire and quartz. The transparent semiconductor layer of the TFT may have a thickness of about 30 nm to about 150 nm. The FPD may be an OLED display device. The pixel part may be connected to the source and drain electrodes of the TFT via at least one electrode layer of an OLED.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1A:
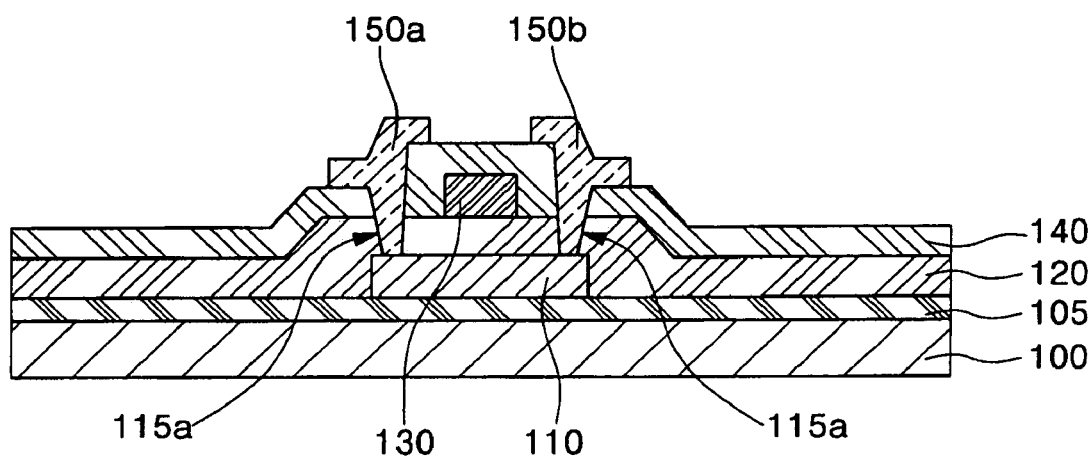
FIG. 1A illustrates a cross-sectional view of a TFT according to an example embodiment.

Korean Patent Application No. 10-2007-0136751, filed on Dec. 24, 2007, in the Korean Intellectual Property Office, and entitled: "Thin Film Transistor, Method of Fabricating Thin Film Transistor and Flat Panel Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not. As used herein, the terms "a" and "an" are open terms that may be used in conjunction with singular items or with plural items.

FIG. 1A illustrates a cross-sectional view of a TFT according to an example embodiment. Referring to FIG. 1A, a TFT may include a substrate 100, a transparent semiconductor layer 110 on the substrate 100, a gate electrode 130 on the transparent semiconductor layer 110, and source/drain electrodes 150a and 150b in contact with the transparent semiconductor layer 110.

The substrate 100 of the TFT may be formed of a transparent material. For example, the substrate 100 may include one or more of a single crystalline silicon, glass, plastic, sapphire and quartz. The substrate may be flexible. A buffer layer 105 may be formed on the substrate 100 to prevent penetration of impurities into the substrate 100.

The transparent semiconductor layer 110 of the TFT may be transparent, e.g., a zinc oxide (ZnO) layer, and may be formed on the substrate 100 by atomic layer deposition (ALD). For example, the transparent semiconductor layer 110 may be formed on the buffer layer 105, so the buffer layer 105 may be between the substrate 100 and the transparent semiconductor layer 110 to prevent penetration of impurities therebetween. The transparent semiconductor layer 110 may be formed to a thickness of about 30 nm to about 150 nm. It is noted that a thickness of the transparent semiconductor layer 110 in a range of about 30 nm to about 150 nm may provide excellent electron mobility and on/off current ratio. It is further noted that thickness of the transparent semiconductor layer 110 may be measured from a lower surface of the transparent semiconductor layer 110, i.e., a surface facing the substrate 100, to an upper surface of the transparent semiconductor layer 110, i.e., a surface opposite the lower surface and facing away from the substrate 100, along a normal to the substrate 100.

The transparent semiconductor layer 110 may have a surface roughness of about 1.3 nm or less. If the surface roughness is more than about 1.3 nm, characteristics of the transparent semiconductor layer 110 may be reduced, e.g., electron mobility may be reduced. It is noted that surface roughness of the transparent semiconductor layer 110 refers to an average roughness, i.e., average height of protrusions on a surface with respect to a reference line.

Formation of the transparent semiconductor layer 110 will be described in more detail below. The substrate 100 may be placed in a chamber, and precursors of a transparent material for forming a transparent semiconductor film may be injected into the chamber to form, e.g., a zinc oxide film, by the ALD method. Once the transparent semiconductor film is formed to a predetermined thickness, the transparent semiconductor film may be patterned to form the transparent semiconductor layer 110, e.g., a zinc oxide layer, on the substrate 100.

For example, a zinc precursor, e.g., diethylzinc, with a carrier gas may be injected into the chamber, so that the zinc precursor reactants, i.e., zinc, may be adsorbed onto the substrate 100. Next, an inert gas, e.g., nitrogen and/or argon, may be injected into the chamber to remove residue, e.g., non-adsorbed molecules, from the chamber. Then, an oxidizing gas, e.g., water vapor ($H_2O$) and/or ozone ($O_3$), may be injected into the chamber to oxidize the zinc adsorbed to the substrate 100 to form a zinc oxide layer on the substrate 100. Then, the inert gas may be injected again into the chamber to remove residue. The inert gas, e.g., argon (Ar) gas, may be injected into the chamber for about 8 seconds, e.g., each time the chamber is purged from residues. The above steps, i.e., injection of zinc precursors, inert gas, and oxidizing gas, may be repeated several times to form the zinc oxide layer to a desired thickness.

The ALD may be performed at low temperature, so material exhibiting relatively low strength or instability at high temperatures, e.g., plastic, may be used to form the substrate 100. For example, since the transparent semiconductor layer 110 may be processed by ALD at a relatively low temperature, the substrate 100 may be formed, e.g., of plastic, to fabricate, e.g., a flexible and transparent FPD device. Further, the transparent semiconductor layer 110, e.g., a zinc oxide layer, formed by the ALD may exhibit a lower surface roughness as compared, e.g., to a zinc oxide layer formed by sputtering. Accordingly, a zinc oxide semiconductor layer according to example embodiments may exhibit substantially higher electron mobility, as compared, e.g., to a zinc oxide layer formed by sputtering.

The gate electrode 130 of the TFT, as illustrated in FIG. 1A, may be formed on the transparent semiconductor layer 110. In particular, a gate insulating layer 120 may be formed of an oxide, e.g., a silicon oxide layer, a nitride, e.g., a silicon nitride layer, a transparent insulating material, or a combination thereof, on the transparent semiconductor layer 110. Next, the gate electrode 130 may be formed of any suitable transparent or semi-transparent material, e.g., one or more of indium tin oxide (ITO), indium zinc oxide (IZO), indium tin zinc oxide (ITZO), and a semi-transparent metal exhibiting conductivity and transparency, on the gate insulating layer 120. An interlayer insulating layer 140 may be formed of an oxide, e.g., a silicon oxide layer, a nitride, e.g., a silicon nitride layer, a transparent insulating material, or a combination thereof, on the gate electrode 130.

As further illustrated in FIG. 1A, contact holes 115a may be formed through the interlayer insulating layer 140 and through the gate insulating layer 120 to expose portions of an upper surface of the transparent semiconductor layer 110. The source/drain electrodes 150a and 150b may be formed on the interlayer insulating layer 140 and in the contact holes 115a, so the source/drain electrodes 150a and 150b may be connected to the transparent semiconductor layer 110 through the contact holes 115a. The source and drain electrodes 150a and 150b may be formed of any suitable transparent or semi-transparent material, e.g., one or more of ITO, IZO, ITZO, and a semi-transparent metal exhibiting conductivity and transparency.

Figure 1B:
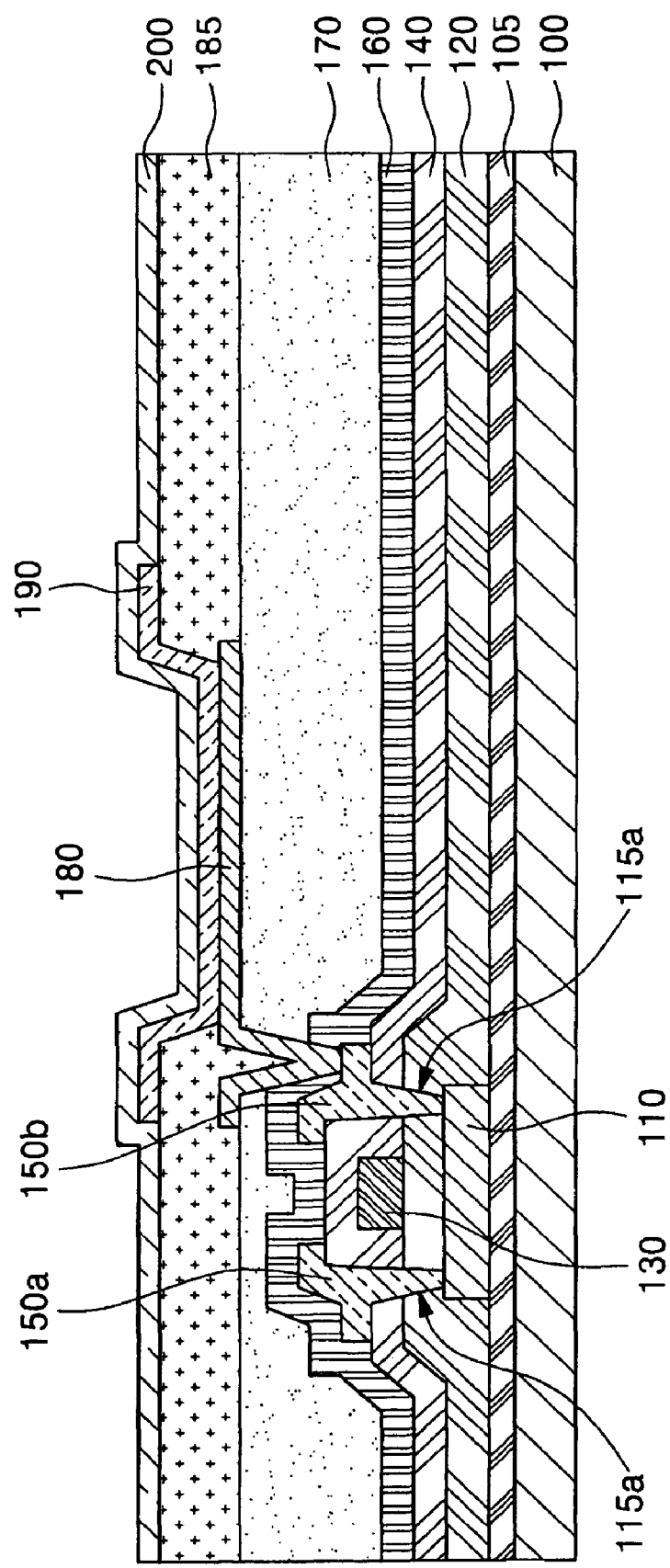
FIG. 1B illustrates a cross-sectional view of a FPD device according to another example embodiment.

A FPD device, e.g., an OLED display device, including the TFT illustrated in FIG. 1A will be described with reference to FIG. 1B. Referring to FIG. 1B, an OLED display device may include the TFT described previously with reference to FIG. 1A, a passivation layer 160 on an entire surface of the substrate 100 to cover the TFT, a planarization layer 170 on the passivation layer 160, and an OLED on the planarization layer 170.

In particular, a via hole 155a may be formed through the planarization layer 170 and through the passivation layer 160 to expose a portion of any one of the source and drain electrodes 150a and 150b of the TFT. A first electrode 180 of the OLED may be formed on the planarization layer 170, and may be electrically connected with any one of the source and drain electrodes 150a and 150b through the via hole 155a. An organic layer 190 and a second electrode 200 may be sequentially formed on the first electrode 180 to complete the OLED. A pixel defining layer 185 may be formed between the planarization layer 170 and the second electrode 200, e.g., a portion of the pixel defining layer 185 may be removed to expose an upper surface of the first electrode 180 to form the organic layer 190 and the second electrode 200 therein.

EXAMPLES

Example 1 a transparent zinc oxide layer was formed according to an example embodiment, i.e., by ALD, and surface roughness of the zinc oxide layer was measured. The transparent zinc oxide layer was used as a semiconductor layer in a TFT. Surface roughness, and electron mobility and S-factor of the TFT were determined as reported in Table 1 below.

Comparative Example 1 a transparent zinc oxide layer was formed by sputtering, and surface roughness of the zinc oxide layer was measured. The transparent zinc oxide layer was used as a semiconductor layer in a TFT, and electron mobility and S-factor of the TFT were determined as reported in Table 1 below.

TABLE 1

|  | Electron Mobility [$cm^2/V \cdot s$] | S factor | Surface Roughness [nm] |
| --- | --- | --- | --- |
| Example 1 | 14.69 | 0.26 | 1.3 |
| Comparative Example 1 | 5.81 | 0.46 | 1.6 |

Referring to Table 1, it can be seen that the zinc oxide layer formed by ALD had a surface roughness of 1.3 nm and exhibited electron mobility of 14.69 $cm^2/V \cdot s$, while the zinc oxide layer formed by sputtering had a surface roughness of 1.6 nm and exhibited electron mobility of 5.81 $cm^2/V \cdot s$. In other words, a zinc oxide layer according to an example embodiment, i.e., Example 1, had a lower surface roughness than the zinc oxide layer of the Comparative Example 1, i.e., by 0.3 nm, and exhibited substantially higher electron mobility than the zinc oxide of the Comparative Example 1, i.e., by a factor higher than 2.5. It is further noted that the zinc oxide layer of the Example 1 exhibited a lower S factor, i.e., 0.26, than that the S factor of the Comparative Example 1, i.e., 0.46. As such, a TFT including a zinc oxide layer according to an example embodiment may exhibit improved characteristics as compared, e.g., to the Comparative Example 1.

A TFT according to example embodiments may include a transparent semiconductor layer having a surface roughness of about 1.3 nm or less, so characteristic thereof, e.g., electron mobility, may be substantially improved. The TFT may be formed, e.g., of zinc oxide, by atomic layer deposition, and thickness of the TFT may be optimized to improve electron mobility and on/off current ratio.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A thin film transistor (TFT), comprising:
a substrate;
a transparent semiconductor layer on the substrate, the transparent semiconductor layer including zinc oxide and being a patterned atomic deposition layer with a surface roughness of about 1.3 nm or less;
a gate electrode on the transparent semiconductor layer;
a gate insulating layer between the gate electrode and the transparent semiconductor layer, the gate insulting layer insulating the gate electrode from the transparent semiconductor layer; and
source and drain electrodes on the substrate, the source and drain electrodes being in contact with the transparent semiconductor layer.
2. The TFT as claimed in claim 1, wherein the substrate includes one or more of a single crystalline silicon, glass, plastic, sapphire and quartz.
3. The TFT as claimed in claim 1, wherein the transparent semiconductor layer has a thickness of about 30 nm to about 150 nm.
4. The TFT as claimed in claim 1, further comprising:
a buffer layer between the substrate and the transparent semiconductor layer; and
an interlayer insulating layer on the gate electrode, the source and drain electrodes being on the interlayer insulating layer.
5. A method of fabricating a thin film transistor (TFT), comprising:
forming a transparent semiconductor layer on a substrate, the transparent semiconductor layer including zinc oxide and exhibiting a surface roughness of about 1.3 nm or less, wherein forming the transparent semiconductor layer includes:
forming a zinc oxide layer on the substrate by atomic layer deposition; and
patterning the zinc oxide layer to form the transparent semiconductor layer, forming a gate insulating layer on the transparent semiconductor layer;

forming a gate electrode on the gate insulting layer, the gate insulating layer insulating the gate electrode from the transparent semiconductor layer; and forming source and drain electrodes on the substrate and in contact with the transparent semiconductor layer.

6. The method as claimed in claim 5, further comprising:

forming a buffer layer between the substrate and the transparent semiconductor layer; and forming an interlayer insulating layer on the gate electrode, the source and drain electrodes being formed on the interlayer insulating layer.

7. The method as claimed in claim 5, wherein the atomic layer deposition includes using water vapor ($H_2O$) and/or ozone ($O_3$) as oxidizing agents.

8. The method as claimed in claim 5, wherein forming the transparent semiconductor layer includes forming the transparent semiconductor layer to a thickness of about 30 nm to about 150 nm.

9. The method as claimed in claim 5, wherein the substrate is formed of one or more of a single crystalline silicon, glass, plastic, sapphire and quartz.

10. A flat panel display (FPD) device, comprising:
a thin film transistor (TFT), including:
 a transparent semiconductor layer on a substrate, the transparent semiconductor layer including zinc oxide and being a patterned atomic deposition layer with a surface roughness of about 1.3 nm or less,
 a gate electrode on the transparent semiconductor layer,
 a gate insulating layer between the gate electrode and the transparent semiconductor layer, the gate insulting layer insulating the gate electrode from the transparent semiconductor layer, and
 source and drain electrodes on the substrate, the source and drain electrodes being in contact with the transparent semiconductor layer; and
a pixel part including at least one pixel and being in electrical communication with the TFT via at least one of the source and drain electrodes of the TFT.

11. The FPD device as claimed in claim 10, wherein the substrate of the TFT includes one or more of a single crystalline silicon, glass, plastic, sapphire and quartz.

12. The FPD device as claimed in claim 10, wherein the transparent semiconductor layer of the TFT has a thickness of about 30 nm to about 150 nm.

13. The FPD device as claimed in claim 10, wherein the FPD is an organic light emitting diode (OLED) display device.

14. The FPD device as claimed in claim 13, wherein the pixel part is connected to the source and drain electrodes of the TFT via at least one electrode layer of an OLED.

15. The FPD device as claimed in claim 10, further comprising:
a buffer layer between the substrate and the transparent semiconductor layer; and
an interlayer insulating layer on the gate electrode, the source and drain electrodes being on the interlayer insulating layer.

* * * * *